(12) United States Patent
Um

(10) Patent No.: US 9,971,217 B2
(45) Date of Patent: May 15, 2018

(54) ARRAY SUBSTRATE AND MANUFACTURING METHOD FOR THE SAME, AND DISPLAY DEVICE

(71) Applicant: BOE TECHNOLOGY GROUP CO., LTD., Beijing (CN)

(72) Inventor: Yoon-Sung Um, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/325,968

(22) PCT Filed: Feb. 25, 2016

(86) PCT No.: PCT/CN2016/074566
§ 371 (c)(1),
(2) Date: Jan. 12, 2017

(87) PCT Pub. No.: WO2016/145978
PCT Pub. Date: Sep. 22, 2016

(65) Prior Publication Data
US 2017/0199441 A1   Jul. 13, 2017

(30) Foreign Application Priority Data
Mar. 17, 2015   (CN) .......................... 2015 1 0117241

(51) Int. Cl.
*H01L 27/14* (2006.01)
*H01L 29/15* (2006.01)
(Continued)

(52) U.S. Cl.
CPC .... *G02F 1/136286* (2013.01); *G02F 1/13439* (2013.01); *G02F 1/134309* (2013.01);
(Continued)

(58) Field of Classification Search
CPC ......... G02F 1/136286; G02F 1/134309; G02F 1/13439; H01L 27/124; H01L 27/1262
(Continued)

(56) References Cited

U.S. PATENT DOCUMENTS

| 2009/0002294 A1 | 1/2009 | Horiguchi et al. |
| 2013/0242215 A1 | 9/2013 | Chang |
| 2014/0375534 A1* | 12/2014 | Lee ...................... G09G 3/3648 345/87 |

FOREIGN PATENT DOCUMENTS

| CN | 102751287 A | 10/2012 |
| CN | 103605241 A | 2/2014 |

(Continued)

OTHER PUBLICATIONS

Written Opinion of the International Searching Authority from corresponding PCT Application No. PCT/CN2016/074566 (5 pages).
(Continued)

*Primary Examiner* — Jami M Valentine
(74) *Attorney, Agent, or Firm* — Harness, Dickey & Pierce, P.L.C.

(57) ABSTRACT

The present disclosure relates to an array substrate and manufacturing method for the same, and a display device. The array substrate comprises a plurality of pixel regions, a plurality of gate lines, and a plurality of data lines. The gate line and the data line are respectively connected to corresponding pixel regions. The pixel region comprises a common electrode and a pixel electrode arranged correspondingly. The array substrate also comprises a plurality of shield electrodes. The shield electrode is arranged to shield an electric field generated by a current flowing through the corresponding gate line. The shield electrode and the common electrode are arranged on the same layer and are insulated from each other. Since the shield electrode and the (Continued)

common electrode are insulated from each other, a change in the electrical signal in the shield electrode does not affect the common electrode.

17 Claims, 2 Drawing Sheets

(51) Int. Cl.
*G02F 1/1362* (2006.01)
*G02F 1/1343* (2006.01)
*H01L 27/12* (2006.01)

(52) U.S. Cl.
CPC ........ *H01L 27/124* (2013.01); *H01L 27/1262* (2013.01); *G02F 2001/136218* (2013.01); *G02F 2001/136295* (2013.01); *G02F 2201/121* (2013.01); *G02F 2201/123* (2013.01)

(58) Field of Classification Search
USPC .............................................. 257/72; 438/149
See application file for complete search history.

(56) References Cited

FOREIGN PATENT DOCUMENTS

| CN | 103676375 A | 3/2014 |
|---|---|---|
| CN | 203883006 U | 10/2014 |
| CN | 104252068 A | 12/2014 |
| CN | 104656324 A | 5/2015 |
| JP | 2004294913 A | 10/2004 |

OTHER PUBLICATIONS

Office Action from corresponding Chinese Application No. 201510117241.9, dated Jan. 22, 2017 (10 pages).

\* cited by examiner ately isolated. The first signal line and the second signal line are electrically isolated.

ARRAY SUBSTRATE AND MANUFACTURING METHOD FOR THE SAME, AND DISPLAY DEVICE

CROSS REFERENCE TO RELATED APPLICATIONS

This application is a National Stage entry of PCT/CN2016/074566 filed Feb. 25, 2016, which claims the benefit and priority of Chinese Patent Application No. 201510117241.9, filed on Mar. 17, 2015, the entire disclosure of each of the above applications are incorporated herein by reference.

BACKGROUND

The present disclosure relates to the field of display technology, and particularly, to an array substrate and a manufacturing method for the same, and a display device.

FIG. 1 is a schematic equivalent circuit diagram of an array substrate of a display panel in the prior art. In the structure of a conventional gate line shielded Advanced Super Dimension Switch (ADS) display panel, a shield electrode 1 for shielding a gate line 3 is connected to a common electrode 2 in the pixel region. In the schematic equivalent circuit diagram as FIG. 1, the shield electrode 1 and the common electrode 2 are equivalent to directly connected wires. Since the operation principle of the shield electrode 1 is to vary synchronously with the signal on the gate line 3 to prevent the electric field generated by the change of a current on the gate lines 3 from affecting other circuit elements, the shield electrode 1 is affected by the signal on the gate line 3. When the common electrode 2 is directly connected to the shield electrode 1, the shield electrode 1 further affects the common electrode 2 in the pixel region.

FIG. 2 is a schematic diagram of a distribution of the common electrode delay difference of a display panel in the prior art. As shown in FIG. 2, the common electrodes 2 affected by the shield electrodes 1 generate common electrode delays, which are different at different positions of the panel. In the display panel, the difference of the delays of the common electrodes 2 produces uneven brightness (MURA defect), so that a visible display defect occurs on the surface of a pixel matrix composed of a plurality of pixel regions when the display panel operates.

BRIEF DESCRIPTION

Embodiments of the present disclosure provide an array substrate and a manufacturing method for the same, and a display device, such that when a shield electrode is affected by a gate line transmission signal, the shield electrode does not affect the common electrode in the pixel region.

According to a first aspect, embodiments of the present disclosure provide an array substrate including a plurality of pixel regions, a plurality of gate lines, and a plurality of data lines. The gate line and the data line are respectively connected to corresponding pixel regions. The pixel region includes a common electrode and a pixel electrode arranged correspondingly. The array substrate further includes a plurality of shield electrodes. The shield electrode is arranged to shield an electric field generated by a current flowing through the corresponding gate line. The shield electrode and the common electrode are arranged on the same layer and are insulated from each other.

In embodiments of the present disclosure, one of the pixel electrode and the common electrode at the light outgoing direction side is a strip electrode, and the other is a plate electrode.

In embodiments of the present disclosure, the array substrate further includes a first signal line arranged to supply power to the shield electrode and a second signal line arranged to supply power to the common electrode. The first signal line and the second signal line are electrically isolated.

In embodiments of the present disclosure, the shield electrode overlaps and is insulated from the corresponding gate line.

In embodiments of the present disclosure, the width of the shield electrode is greater than or equal to the width of the gate line.

In embodiments of the present disclosure, the materials of the shield electrode and the common electrode are the same.

In embodiments of the present disclosure, the shield electrode and the common electrode are formed in the same process.

According to a second aspect, embodiments of the present disclosure provide a display device including the array substrate of any one of the above.

According to a third aspect, embodiments of the present disclosure provide a manufacturing method for an array substrate including: forming a plurality of pixel regions, a plurality of gate lines, and a plurality of data lines, wherein the gate line and the data line are respectively connected to corresponding pixel regions, and the pixel region includes a pixel electrode and a common electrode arranged correspondingly; and forming a plurality of shield electrodes, wherein the shield electrode is arranged to shield an electric field generated by a current flowing through the corresponding gate line, and the shield electrode and the common electrode are arranged on the same layer and are insulated from each other.

In embodiments of the present disclosure, one of the pixel electrode and the common electrode at the light outgoing direction side is a strip electrode, and the other is a plate electrode.

In embodiments of the present disclosure, the manufacturing method for an array substrate further includes: forming a first signal line and a second signal line electrically isolated such that the first signal line supplies power to the shield electrode and the second signal line supplies power to the common electrode. The first signal line and the second signal line are electrically isolated.

In embodiments of the present disclosure, forming a plurality of shield electrodes includes causing the shield electrode to overlap and be insulated from the corresponding gate line.

In embodiments of the present disclosure, the width of the shield electrode is greater than or equal to the width of the gate line.

In embodiments of the present disclosure, the materials of the shield electrode and the common electrode are the same.

In the embodiment of the present disclosure, the shield electrode is formed in the same process for forming the common electrode.

With the above technical solutions, when the electrical signal in the gate line affects the shield electrode, since the shield electrode and the common electrode are insulated from each other, a change in the electrical signal in the shield electrode does not affect the common electrode. Thus, the common electrodes at different positions on the display panel have the same delay, preventing the occurrence of uneven brightness of the display panel.

BRIEF DESCRIPTION OF THE DRAWINGS

The features and advantages of the present disclosure will be understood more clearly with reference to the accompanying drawings, which are schematic and are not to be construed as limiting the present disclosure, in which.

DETAILED DESCRIPTION

For a better understanding of the above features and advantages of the present disclosure, the present disclosure will be described in further detail with reference to the accompanying drawings and detailed description. Obviously, the described embodiments are only a part of the embodiments of the present disclosure, but not all of the embodiments. All other embodiments obtained by a person skilled in the art based on the embodiments of the present disclosure without creative effort are within the scope of the protection of the present disclosure. It should be noted that the embodiments of the present disclosure and the features of the embodiments may be combined with each other when there is no conflict.

In the following description, numerous specific details are set forth in order to provide a thorough understanding of the present disclosure, but the present disclosure may be embodied in other specific forms besides those described herein. Thus, the scope of the protection of the present disclosure is not limited by the specific embodiments disclosed below.

Figure 1:
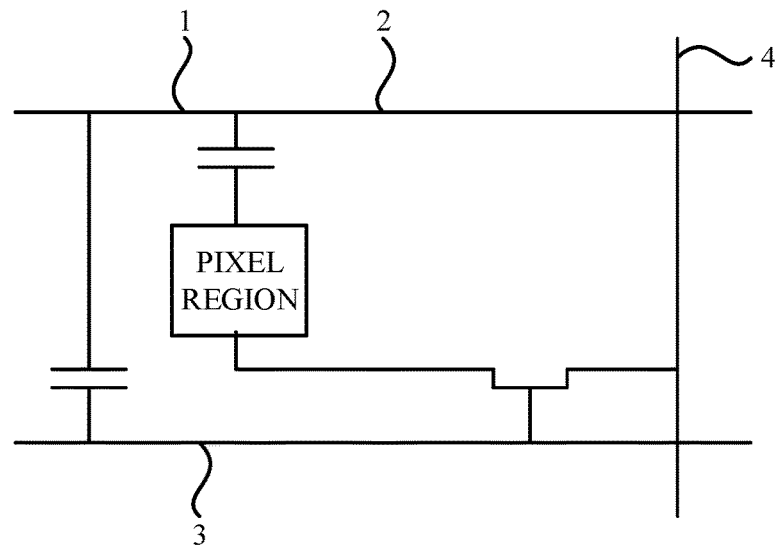
FIG. 1 is a schematic equivalent circuit diagram of an array substrate of a display panel in the prior art.
Figure 2:
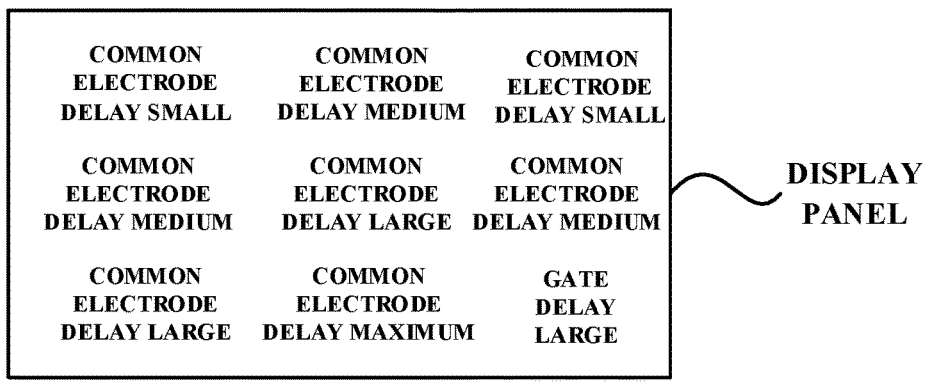
FIG. 2 is a schematic diagram of a distribution of the common electrode delay difference of a display panel in the prior art.
Figure 3:
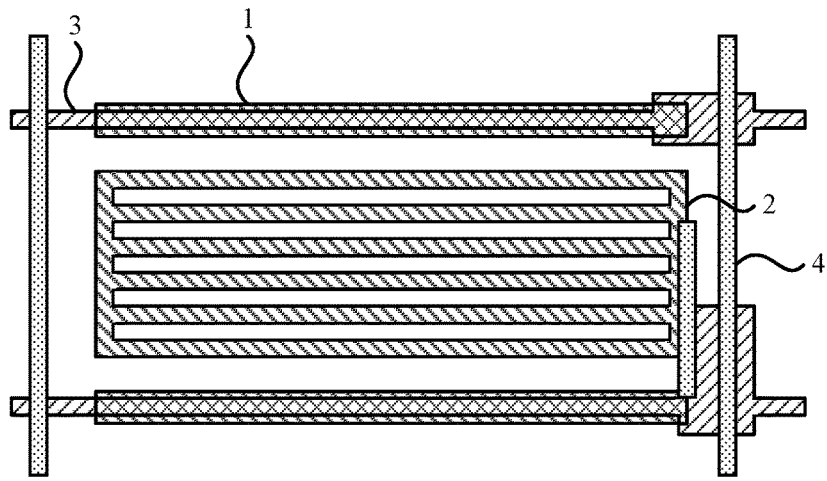
FIG. 3 is a schematic structural diagram of an array substrate according to a first embodiment of the present disclosure.
Figure 4:
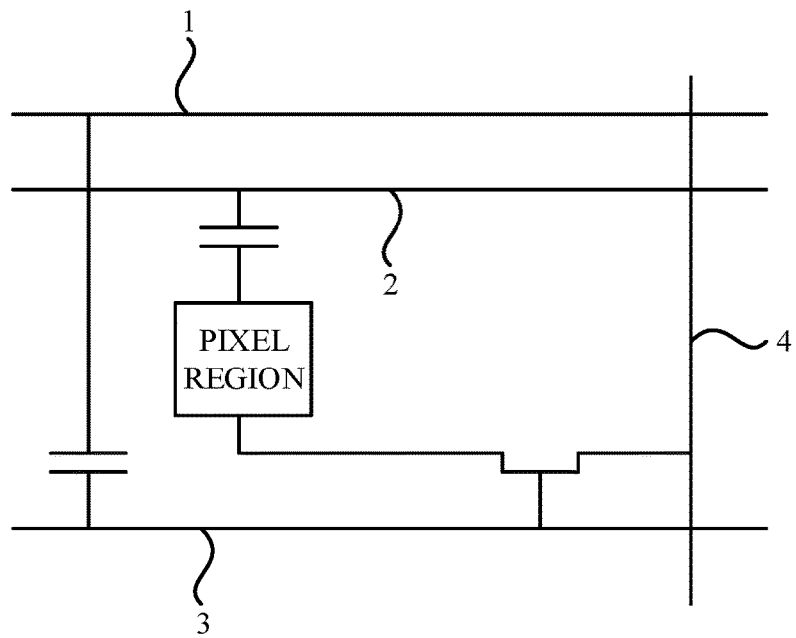
FIG. 4 is a schematic equivalent circuit diagram of the array substrate shown in FIG. 3.

FIG. 3 is a schematic structural diagram of an array substrate according to a first embodiment of the present disclosure. FIG. 4 is a schematic equivalent circuit diagram of the array substrate shown in FIG. 3. As shown in FIGS. 3 and 4, the array substrate includes a plurality of pixel regions, a plurality of gate lines 3, and a plurality of data lines 4. The gate line 3 and the data line 4 are respectively connected to corresponding pixel regions. The pixel region includes a common electrode 2 a and pixel electrode arranged correspondingly. The array substrate also includes a plurality of shield electrodes 1. The shield electrode 1 is arranged to shield an electric field generated by a current flowing through the corresponding gate line 3. The shield electrode 1 and the common electrode 2 are arranged on the same layer and are insulated from each other.

The shield electrode 1 arranged in the gate line region may shield the influence of the electric field generated when a current flows through the gate line 3 to other wirings, but the shield electrode 1 itself is affected by the gate line 3. According to the array substrate in this example, when the electrical signal in the gate line 3 affects the shield electrode 1, since the shield electrode 1 and the common electrode 2 are insulated from each other, a change in the electrical signal in the shield electrode 1 does not affect the common electrode 2. Thus, the common electrodes at different positions on the display panel always have the same delay, and the common electrode 2 of each pixel region can be charged from the reference voltage of 0V for the display process of the pixel regions, preventing the occurrence of uneven brightness of the display panel.

It should be noted that in order to explain the main principle of the embodiment of the present disclosure more clearly, the illustration of the source, the drain, the active layer, and other structures associated with the transistor circuit in the pixel regions of the array substrate is omitted in FIG. 3.

In embodiments of the present disclosure, one of the pixel electrode and the common electrode at the light outgoing direction side is a strip electrode, and the other is a plate electrode.

FIG. 3 is a vertical view of the array substrate, that is, an illustration of the array substrate viewed from the light outgoing direction side. In FIG. 3, if the common electrode 2 is located below the pixel electrode, the common electrode 2 is a plate electrodes and the pixel electrode is a strip electrode. It is to be understood that the positions of the common electrode 2 and the pixel electrode may be exchanged, if the pixel electrode is located below the common electrode 2, the pixel electrode is a plate electrode and the common electrode 2 is a strip electrode. With the plate-shaped pixel electrode in the lower portion and the stripe-shaped common electrode 2 in the upper portion, or with the plate-shaped common electrode 2 in the lower portion and the stripe-shaped pixel electrode in the upper portion, it may be ensured that ADS technology can be applied to the array substrate, that is, the array substrate can be a substrate based on Advanced Super Dimension Switch technology.

Since the pixel electrode or the common electrode 2 in the lower portion of the substrate is a plate electrode and the corresponding common electrode 2 or the pixel electrode in the upper portion is a stripe electrode, liquid crystal molecules sandwiched between the pixel electrode and the common electrode 2 are horizontally arranged. When forced by an external pressure, the liquid crystal molecular structure sinks down slightly, but is still horizontal overall. Whereas, soft-screen liquid crystal molecules in the prior art are vertically arranged, and when forced by an external pressure, they will sink down significantly, and exhibit a """ shape, with a slow recovery rate. The liquid crystal recovery rate in the array substrate of the embodiment of the present disclosure is 10 times than that of the soft-screen array substrate in the prior art. When forced by an external pressure, the structure of the liquid crystal molecules in the array substrate of the embodiment of the present disclosure is far superior to that in the soft screen in terms of structural firmness and stability, and in actual application, it represents no water ripple or screen flash when pressed, and has clearer and stabler image quality.

The array substrate of the embodiment of the present disclosure has a wider viewing angle than other liquid crystal panels (e.g., TN panels), and the up-down and left-right viewing angles both reach 178°. The array substrate of the embodiment of the present disclosure has a higher color rendering power, and has a higher light transmittance rate and chroma than other liquid crystal screens (e.g., IPS panels) since metal electrodes that cause the decrease in brightness and chroma can be discarded and ITO transparent electrodes can be used to increase the aperture ratio and the brightness. In addition, the substrate of the present disclosure can be made by multiple dimension switch technology to have a higher liquid crystal molecule response rate, and avoid tailing and ghost phenomenon, so as to better display moving pictures.

In embodiments of the present disclosure, the array substrate may further include a first signal line arranged to supply power to the shield electrode 1 and a second signal line arranged to supply power to the common electrode 2. The first signal line and the second signal line are electrically isolated.

Power is supplied to the shield electrode 1 and the common electrode 2 respectively through the first signal line and the second signal line electrically isolated, and different electrical signals may be provided to the shield electrode 1 and the common electrode 2 according to arrangements, thereby avoiding the influence of the shield electrode 1 on the common electrode 2 while ensuring a better shielding effect of the shield electrode 1 on the electrical signal in the gate line 3, so that the common electrodes 2 can be better used for display of the display regions.

In embodiments of the present disclosure, the shield electrode 1 and the corresponding gate line 3 may overlap and be insulated from each other. As shown in FIG. 3, the shield electrode 1 is arranged in the region above the gate insulating layer and overlapping the gate line 3, so that the shield electrode 1 can better isolate the electrical signal of the gate line 3.

In embodiments of the present disclosure, the width of the shield electrode 1 may be greater than or equal to the width of the gate line 3. It may be ensured that the shield electrode 1 completely shields the gate line 3 to provide a better shielding and anti-interference effect to the gate line 3 while the shield electrode 3 has a smaller resistance at the same time.

In embodiments of the present disclosure, the materials of the shield electrode 1 and the common electrode 2 may be the same.

The material of the common electrodes 2 has a high transmittance, whereby manufacturing the shield electrodes 1 with this material can ensure that the shield electrodes 1 also have a high transmittance and thus improve the transmittance of the entire array substrate.

In embodiments of the present disclosure, the shield electrode 1 and the common electrode 2 may be formed in the same process. It is possible to reduce the number of processes for forming the array substrate, thereby simplifying the processes for manufacturing the array substrate, and without changing the prior wiring pattern in the array substrate.

The second embodiment of the present disclosure further provides a display device including the array substrate of any one of the above. It should be noted that the display device in the present embodiment may be any product or component having a display function such as an electronic paper, a mobile phone, a tablet computer, a television set, a notebook computer, a digital photo frame, a navigator or the like.

Figure 5:
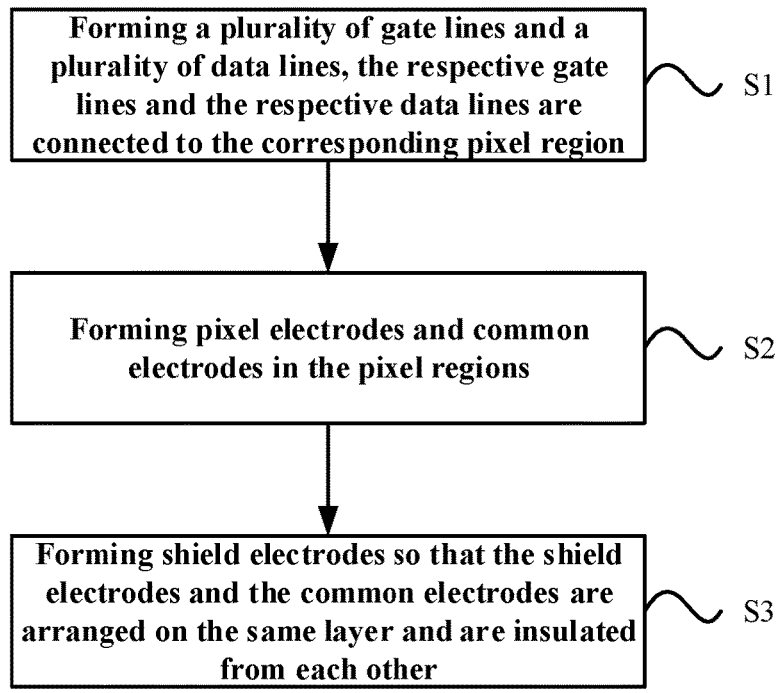
FIG. 5 is a schematic flow chart of a manufacturing method for an array substrate according to a third embodiment of the present disclosure.

FIG. 5 is a schematic flow chart of a manufacturing method for an array substrate according to the third embodiment of the present disclosure. The method for manufacturing the array substrate includes forming a plurality of pixel regions, a plurality of gate lines 3, and a plurality of data lines 4. The gate line 3 and the data line 4 are respectively connected to corresponding pixel regions. The pixel region includes a common electrode 2 and a pixel electrode arranged correspondingly. A plurality of shield electrodes 1 are formed. The shield electrode 1 is arranged to shield an electric field generated by a current flowing through the corresponding gate line 3. The shield electrode 1 and the common electrode 2 are insulated from each other.

In embodiments of the present disclosure, one of the pixel electrode and the common electrode 2 at the light outgoing direction side is a strip electrode, and the other is a plate electrode. When the formed pixel electrode is located below the common electrode 2, the pixel electrode is a plate electrode, and the common electrode 2 is strip electrode. When the formed common electrode 2 is located below the pixel electrode, the common electrode 2 is a plate electrode, and the pixel electrode is a strip electrode.

In embodiments of the present disclosure, the manufacturing method for an array substrate may further include forming a first signal line and a second signal line such that the first signal line supplies power to the shield electrode 1 and the second signal line supplies power to the common electrode 2. The first signal line and the second signal line are electrically isolated. The first signal line and the second signal line may be formed in the same process or in different processes, and the operations of forming the first signal line and the second signal line may be performed before or after the common electrode 2 is formed, depending on the specific process needs.

In embodiments of the present disclosure, forming a plurality of shield electrodes 1 in the method for manufacturing the array substrate may further include causing the shield electrode 1 to overlap and be insulated from the corresponding gate line 3.

In embodiments of the present disclosure, the width of the shield electrode 1 may be greater than or equal to the width of the gate line 3.

In embodiments of the present disclosure, the material of the shield electrode 1 and the common electrode 2 may be the same.

In embodiments of the present disclosure, the shield electrodes 1 may be formed in the same process for forming the common electrodes 2.

The process employed in the above-described steps may include, for example, a film forming process such as deposition, sputtering, and a patterning process like etching.

It is to be understood that although the manufacturing method for an array substrate is illustrated in FIG. 5 in a plurality of steps, this is not a limitation on the order of the method for manufacturing the array substrate, and the order of forming various portions of the array substrate may be adjusted according to the actual situations.

The technical solutions of the prevent disclosure are described hereinabove in combination with the drawings, considering that in the prior art the shield electrodes shielding the gate lines are connected to the common electrodes in the pixel regions and the shield electrodes affect the common electrodes in the pixel regions since the shield electrodes in the gate line regions are affected by the gate line signals. In embodiments of the present disclosure, when the electrical signal in the gate line affects the shield electrode, a change in the electrical signal in the shield electrode does not affect the common electrode, since the shield electrode and the common electrode are insulated from each other, thus the common electrodes at different positions on the display panel have the same delay, preventing the occurrence of uneven brightness of the display panel.

It is to be noted that in the drawings, the dimensions of the layers and regions may be exaggerated for clarity of illustration. It is also to be understood that when an element or layer is referred to as being "on" another element or layer, it may be directly on the other element, or an intermediate layer may exist. In addition, it is to be understood that when an element or layer is referred to as "below" another element or layer, it may be directly below the other element, or more than one intermediate layer or element may exist. In addition, it is also to be understood that when a layer or element is referred to as being "between" two layers or two elements, it may be a single layer between the two layers or two elements, or more than one intermediate layer or element may exist. Similar reference numerals refer to similar elements throughout.

In the present disclosure, the terms "first" and "second" are used for the purpose of description only and are not to be taken as an indication or suggestion of relative importance. The term "a plurality of" refers to two or more, unless otherwise specifically limited.

The foregoings are intended only as preferred embodiments of the present disclosure and are not intended to limit the present disclosure. To those skilled in the art, there may be various changes and modifications of the present disclosure. Any modifications, equivalent substitutions, improvements and the like within the spirit and principle of the present disclosure are intended to be included within the scope of the present disclosure.

The invention claimed is:

1. An array substrate comprising:
   a plurality of pixel regions;
   a plurality of gate lines;
   a plurality of data lines, wherein the gate lines and the data lines are respectively connected to corresponding pixel regions, and at least one of the plurality of pixel regions comprises a common electrode and a pixel electrode; and
   a plurality of shield electrodes, wherein at least one of the plurality of shield electrodes is arranged to shield an electric field generated by a current flowing through a corresponding one of the plurality of gate lines, and the at least one of the plurality of shield electrodes and the common electrode are arranged on the same layer and are insulated from each other;
   wherein one of the pixel electrode and the common electrode at a light outgoing direction side of the array substrate is a strip electrode, and the other is a plate electrode.

2. The array substrate according to claim 1 further comprising:
   a first signal line arranged to supply power to the at least one of the plurality of shield electrodes; and
   a second signal line arranged to supply power to the common electrode, wherein the first signal line and the second signal line are electrically isolated.

3. The array substrate according to claim 1, wherein the at least one of the plurality of shield electrodes overlaps and is insulated from the corresponding gate line.

4. The array substrate according to claim 3, wherein a width of the at least one of the plurality of shield electrodes is greater than or equal to a width of the corresponding gate line.

5. The array substrate according to claim 1, wherein materials of the at least one of the plurality of shield electrodes and the common electrode are the same.

6. The array substrate according to claim 5, wherein the at least one of the plurality of shield electrodes and the common electrode are formed by the same process.

7. A display device comprising the array substrate of claim 1.

8. A manufacturing method for an array substrate, the method comprising:
   forming a plurality of pixel regions, a plurality of gate lines, and a plurality of data lines, wherein the gate lines and the data lines are respectively connected to corresponding pixel regions, and wherein at least one of the plurality of pixel regions comprises a pixel electrode and a common electrode; and
   forming a plurality of shield electrodes, wherein at least one of the plurality of shield electrodes is arranged to shield an electric field generated by a current flowing through a corresponding one of the plurality of gate lines, and wherein the at least one of the plurality of shield electrodes and the common electrode are arranged on the same layer and are insulated from each other;
   wherein one of the pixel electrode and the common electrode at a light outgoing direction side of the array substrate is a strip electrode, and the other is a plate electrode.

9. The manufacturing method for an array substrate according to claim 8, further comprising:
   forming a first signal line and a second signal line such that the first signal line supplies power to the at least one of the plurality of shield electrodes and the second signal line supplies power to the common electrode, wherein the first signal line and the second signal line are electrically isolated.

10. The manufacturing method for an array substrate according to claim 8, wherein forming a plurality of shield electrodes comprises:
    forming the at least one of the plurality of shield electrodes to overlap and be insulated from the corresponding gate line.

11. The manufacturing method for an array substrate according to claim 10, wherein a width of the at least one of the plurality of shield electrodes is greater than or equal to a width of the corresponding gate line.

12. The manufacturing method for an array substrate according to claim 8, wherein materials of the at least one of the plurality of shield electrodes and the common electrode are the same.

13. The manufacturing method for an array substrate according to claim 12, wherein the at least one of the plurality of shield electrodes is formed in the same process for forming the common electrode.

14. The display device according to claim 7, wherein the array substrate further comprises:
    a first signal line arranged to supply power to the at least one of the plurality of shield electrodes, and a second signal line arranged to supply power to the common electrode, wherein the first signal line and the second signal line are electrically isolated.

15. The display device according to claim 7, wherein the at least one of the plurality of shield electrodes overlaps and is insulated from the corresponding gate line.

16. The display device according to claim 15, wherein a width of the at least one of the plurality of shield electrodes is greater than or equal to a width of the corresponding gate line.

17. The display device according to claim 7, wherein materials of the at least one of the plurality of shield electrodes and the common electrode are the same.

* * * * *